United States Patent [19]

Nuckolls et al.

[11] Patent Number: 5,506,875
[45] Date of Patent: Apr. 9, 1996

[54] METHOD AND APPARATUS FOR PERFORMING FREQUENCY ACQUISITION IN ALL DIGITAL PHASE LOCK LOOP

[75] Inventors: Charles E. Nuckolls; James R. Lundberg; Gerald W. Garcia, all of Austin, Tex.

[73] Assignee: Motorola, Inc., Schaumburg, Ill.

[21] Appl. No.: 165,686

[22] Filed: Dec. 13, 1993

[51] Int. Cl.$^6$ .................................................. H03D 3/24
[52] U.S. Cl. .......................... 375/375; 375/376; 455/260; 327/39; 327/150; 327/159; 331/34
[58] Field of Search ...................................... 455/260, 265; 331/1 R, 18, 25, 34, DIG. 2, 177 R; 327/1, 2, 39, 40, 141, 147, 150, 155, 156, 159; 375/371–376

[56] References Cited

U.S. PATENT DOCUMENTS 4,577,163  3/1986  Culp ........................................ 331/1 A
4,795,985  1/1989  Gailbreath, Jr. ......................... 328/155
5,109,394  4/1992  Hjerpe et al. ............................ 375/120

Primary Examiner—Stephen Chin
Assistant Examiner—Hai H. Phan
Attorney, Agent, or Firm—Charlotte B. Whitaker

[57] ABSTRACT

A method and apparatus for performing frequency acquisition. Frequency acquisition is accomplished by utilizing binary-search techniques with a controller (13), variable digital oscillator (16), frequency detector (11) an incrementor (19) and decrementor (21) and control registers (22). The frequency detector (11) generates an output indicating the relative speed of the variable oscillator (16) with reference to a externally provided signal. Depending on the output of the frequency detector (11), the arithmetic logic circuitry (19, 21) will increase or decrease the value in a control register (22), resulting in a corresponding increase or decrease in speed of the variable oscillator (16). The magnitude of changes to the control register (22) is gradually reduced as the steps of frequency detection and arithmetic updates are repeated until the variable oscillator (16) has reached the proper frequency.

20 Claims, 2 Drawing Sheets

METHOD AND APPARATUS FOR PERFORMING FREQUENCY ACQUISITION IN ALL DIGITAL PHASE LOCK LOOP

CROSS-REFERENCE TO RELATED APPLICATIONS

This application is related to the following applications:

1. "A METHOD AND APPARATUS FOR PERFORMING FREQUENCY DETECTION", Ser. No. 08/165,685, by Lundberg et al.;

2. "A METHOD AND APPARATUS FOR DETERMINING A CONSTANT GAIN OF A VARIABLE OSCILLATOR", Ser. No. 08/165,687, by Lundberg et al.;

3. "A METHOD AND APPARATUS FOR PERFORMING PHASE ACQUISITION AND PHASE MAINTENANCE IN AN ALL DIGITAL PHASE LOCK LOOP", Ser. No. 08/165,681, by Nuckolls et al.;

4. "A METHOD AND APPARATUS FOR PERFORMING FREQUENCY TRACKING IN AN ALL DIGITAL PHASE LOCK LOOP", Ser. No. 08/165,682 by Nuckolls et al.

All of which are filed simultaneously herewith and assigned to the assignee hereof.

FIELD OF THE INVENTION

This invention relates generally to digital phase-locked loops, and more particularly to a frequency acquisition mechanism in a digital phase locked loop systems.

BACKGROUND OF THE INVENTION

Generally, the implementation of a phase-locked loop (PLL) requires the acquisition of an appropriate frequency and phase using an internal ring oscillator. Analog phase-locked loops typically use a voltage-controlled oscillator (VCO) to generate a period signal that is "locked" to a reference clock signal. The frequency of the VCO is modulated by an analog voltage adjusted via a feedback mechanism. Typically, the feedback mechanism is supplied from a sequential phase/frequency detector. The sequential phase/frequency detector outputs an "up" or "down" pulse proportional to phase-error width and in the direction required to pull in the frequency of the VCO output signal to the target reference clock signal. The output of a sequential phase/frequency detector usually enables a charge pump driving to a loop filter (RC), which in turn controls the frequency of the VCO. The detector outputs can be arbitrarily small, and thus there is usually a dead band associated with such a detector where, for a certain window of time, there is no detectable output. Accordingly, during the dead band ("window width"), the PLL can detect neither "up" nor "down" pulses for a phase/frequency error of a magnitude equal to or less than the window width. This technique has been used in many applications, and requires careful tuning to maintain the right damping characteristics.

The gain of the VCO is defined as dF/dV (the change in VCO frequency per change in the analog control voltage). The maximum change in frequency occurs when there is a maximum amount of phase error during a given cycle (maximum dV). The change in analog control voltage (dV), depends on many parameters, such as the charge pump, loop filter, etc. Consequently, the loop gain of the PLL requires careful tuning of these parameters to maintain the right damping characteristics. If the gain is too high, the PLL will be unstable, resulting in excessive jitter or loss of lock. Conversely, if the gain is too low, the PLL may not be able to track frequency drift due to fluctuations in the reference frequency, $V_{DD}$, or temperature. Thus, the gain (dF/dV) must be constrained, which causes the PLL to suffer unnecessary time penalties during phase and frequency acquisition.

In today's high performance microprocessors, an emphasis is placed on low-power operation without compromising the high performance of the microprocessor. As portable applications proliferate, it is desirable to incorporate power management techniques to reduce power and extend battery life. One of these techniques entails shutting down the microprocessor while statically maintaining code. This state is called low power stop (LPSTOP), where the microprocessor is completely quiescent, using no power. In portable applications, it is desirable to be able to force microprocessors in and out of the low-power states (LPSTOP) very rapidly. Historically, the largest performance penalty in cycling in and out of LPSTOP has been the amount of time the PLL requires to re-acquire phase lock. Essentially, the frequency at which LPSTOP can be used is dictated by how fast a PLL can acquire (re-acquire) phase-lock. Thus, slow lock times reduce the frequency of entering/leaving LPSTOP and result in increased power dissipation. Fast lock times increase the frequency of entering LPSTOP, and reduce power dissipation. Known analog PLL's have long lock times due to the constraints imposed upon the gain. It is desirable, therefore, to have a PLL capable of very fast frequency acquisition which reduces the phase acquisition time penalty, and thereby provides rapid exit from a low-power state.

SUMMARY OF THE INVENTION

The present invention provides a method and apparatus for performing frequency acquisition in a phase-locked loop. Frequency acquisition is accomplished in a phase-locked loop by utilizing binary-search techniques. A binary-weighted control value is stored in a control register and used to implement changes to the frequency and phase of an output signal provided by a variable oscillator. A frequency detector generates an output indicating the relative speed of the variable oscillator with reference to an externally provided reference clock signal. Depending on the output of the frequency detector, arithmetic logic will increase or decrease the control value stored in the control register by a gain value, after each frequency detect cycle, resulting in a corresponding increase or decrease in speed of the variable oscillator. A controller progressively decreases the magnitude of changes made to the control value after each frequency detect cycle, by dividing the gain value by a variable amount every time a change in search direction occurs. The steps of frequency detection and arithmetic updates are repeated until the variable oscillator has reached the proper frequency.

DETAILED DESCRIPTION OF A PREFERRED EMBODIMENT

Figure 1:
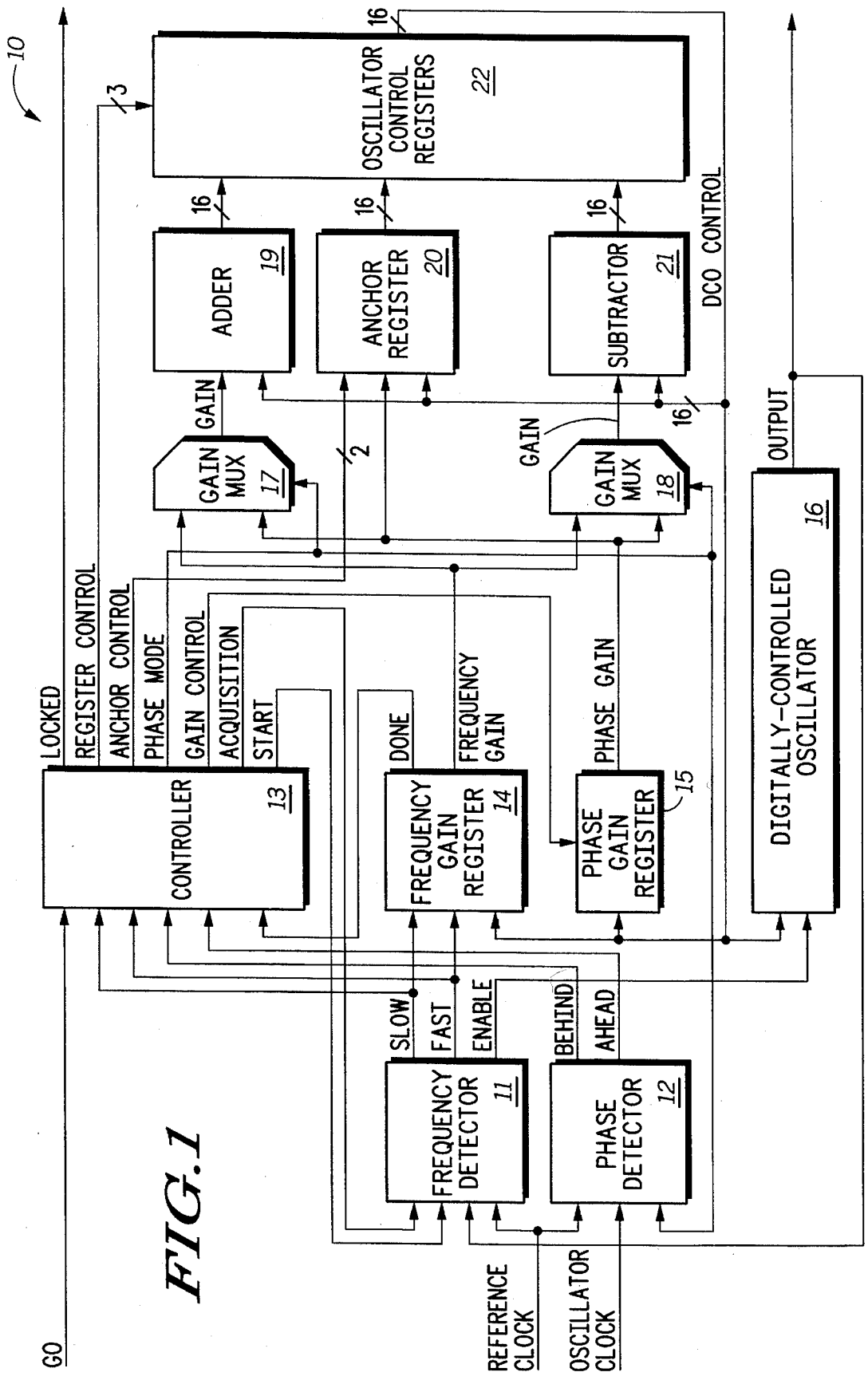
FIG. 1 illustrates in block diagram form an all digital phase-locked loop (ADPLL), in accordance with a preferred embodiment of the present invention.

The present invention can be more fully described with reference to FIGS. 1 and 2. Illustrated in FIG. 1 is a block diagram of an all digital phase-locked loop (ADPLL) 10, in accordance with a preferred embodiment of the present invention. In a preferred embodiment, the ADPLL 10 has four modes of operation, frequency acquisition, phase acquisition, phase maintenance and frequency maintenance. The ADPLL 10 includes a frequency detector 11, a phase detector 12, a controller 13, frequency and phase gain registers 14 and 15, respectively, a digitally-controlled oscillator (DCO) 16, gain multiplexors 17 and 18, adder 19, anchor register 20, and subtractor 21. The DCO 16 uses a sixteen bit binarily-weighted control signal (DCO CONTROL) to implement changes in the frequency and phase of the DCO output, as disclosed in a patent application entitled "Delay Element With Digitally Controllable Gain" Ser. No. 07/993,757, by Lundberg et al. filed on Dec. 21, 1992 and assigned to the assignee hereof. The binary value of these control signals determines the frequency of the DCO 16. The DCO 16 has a gain which is defined as dF/d(DCO CONTROL). Thus, the larger the change in the binary value held by the DCO CONTROL signals, the larger the change in the frequency of the DCO 16. Accordingly, the frequency of the DCO is changed via arithmetic increments or decrements to the sixteen control bits. During frequency acquisition the frequency detector 11 outputs a digital signal either "FAST" or "SLOW" every other reference clock boundary. The FAST or SLOW digital signal initiates an increment or decrement to the DCO control register 22. The magnitude of the increments or decrements to the DCO control register 22 (the frequency gain), is dictated by the frequency gain register 14.

The ADPLL 10 starts in the frequency acquisition mode. In the frequency acquisition mode, the DCO control register 22 is initialized to a value of $4000 (where "$" refers to a hexadecimal value), in accordance with a preferred embodiment. Starting with a frequency gain of $2000, provided by the frequency gain register 14, and using a modified binary search algorithm, the DCO control register 22 is updated based on the output signal provided by the frequency detector 11. During frequency acquisition, the frequency detector 11 performs a digital frequency comparison between the reference clock signal and the OUTPUT signal provided by the DCO 16, and outputs a FAST or SLOW signal every two reference clock cycles. In a preferred embodiment, the gain is reduced every time a change in search direction occurs (i.e., a shift in the frequency gain register 14 occurs). Accordingly, one shift in the frequency gain register 14 causes a reduction in frequency gain by a factor of four, but only for one of either the subtract gain value or the add gain value. On successive shifts, gain reduction alternates between the add gain value and the subtract gain value. On every change in search direction, the frequency gain is reduced by a factor of two, as illustrated in Table I below.

In accordance with a preferred embodiment of the present invention, there is a one-to-one mapping of frequency gain weights to DCO CONTROL weights; for instance, an add gain value of $4000 would present an increment to the DCO CONTROL value of 100% if the DCO CONTROL value was $4000, as demonstrated in the first frequency detect cycle of Table I. When the frequency gain value stored in the frequency gain register 14 is less than the DCO CONTROL value stored in the DCO control register 22 bit-shifted right by ten bit positions, a frequency match has occurred between the reference clock signal and the output of the DCO 16 to an error of one in $2^{10}$ or +/−0.1%. The ADPLL 10 then completes frequency acquisition by transferring the value in the DCO control register 22 to the anchor register 20, thereby storing the baseline frequency value in the anchor register 20.

TABLE I

| Frequency Detector Output/Cycle | | Add Gain | Subtract Gain | CONTROL |
|---|---|---|---|---|
| Initial | | $4000 | $2000 | $4000 |
| Cycle 1. Result: | SLOW | $4000 | $2000 | $8000 |
| Cycle 2. Result: | FAST | $1000 | $2000 | $6000 |
| Cycle 3. Result: | SLOW | $1000 | $800 | $7000 |
| Cycle 4. Result: | SLOW | $1000 | $800 | $8000 |
| Cycle 5. Result: | FAST | $400 | $800 | $7800 |
| Cycle 6. Result: | SLOW | $400 | $200 | $7C00 |
| Cycle 7. Result: | FAST | $100 | $200 | $7A00 |
| Cycle 8. Result: | SLOW | $100 | $80 | $7B00 |
| Cycle 9. Result: | SLOW | $100 | $80 | $7C00 |
| Cycle 10. Result: | FAST | $40 | $80 | $7B80 |

Phase acquisition aligns the buffered output (divided by two) of the DCO 16 to the reference clock signal. On the rising edge of every reference clock signal, the phase detector 12 outputs a digital signal "AHEAD" or "BEHIND". During phase acquisition, the DCO control register 22 is incremented or decremented (in one direction only) every reference clock cycle by the gain value stored in the phase gain register 15, until a change in polarity of the phase error is detected. The phase gain register 15 stores a bit shifted value of the DCO CONTROL value (base frequency) currently stored in the DCO control register 22. Upon detecting the change in the polarity of the phase error, the ADPLL 10 completes phase lock by loading the value stored in the anchor register 20 into the DCO control register 22, thereby restoring the DCO control register 22 to the baseline frequency.

When phase acquisition is complete, phase-locking has been achieved, and the ADPLL 10 enters a phase/frequency maintenance mode of operation. During phase maintenance, the DCO control register 22 is incremented or decremented every cycle (based on the output of the phase detector 12) by the gain value stored in the phase gain register 15, unless a change in the polarity of the phase error is detected. If a change in the polarity of the phase error is detected, the value stored in the anchor register 20 is loaded into the DCO control register 22 to restore the baseline frequency. Also, when a change in phase-error polarity is detected, the shift displacement of the phase-gain register 15 is incremented (unless the shift displacement is at a maximum value), thereby reducing the phase gain by a factor of two. In a preferred embodiment, if a change in polarity is not detected for eight consecutive phase cycles, the phase gain shift displacement is decremented (unless the shift displacement is at a minimum value), thereby increasing the phase gain by a factor of two. This mechanism allows the phase gain to change as operating conditions warrant.

Frequency maintenance occurs concurrently with phase maintenance. In accordance with the preferred embodiment, the anchor register 20 is updated during frequency maintenance, thereby changing the baseline frequency of operation of the DCO 16. After phase acquisition, if four consecutive increments of the DCO control register 22 occur, then the anchor register 20 is incremented once by the phase gain value stored in the phase gain register 15. Similarly, if four consecutive decrements of the DCO control register 22 occur, the anchor register 20 is decremented once by the phase gain value. This mechanism allows the baseline frequency to track as operating conditions change with time.

Figure 2:
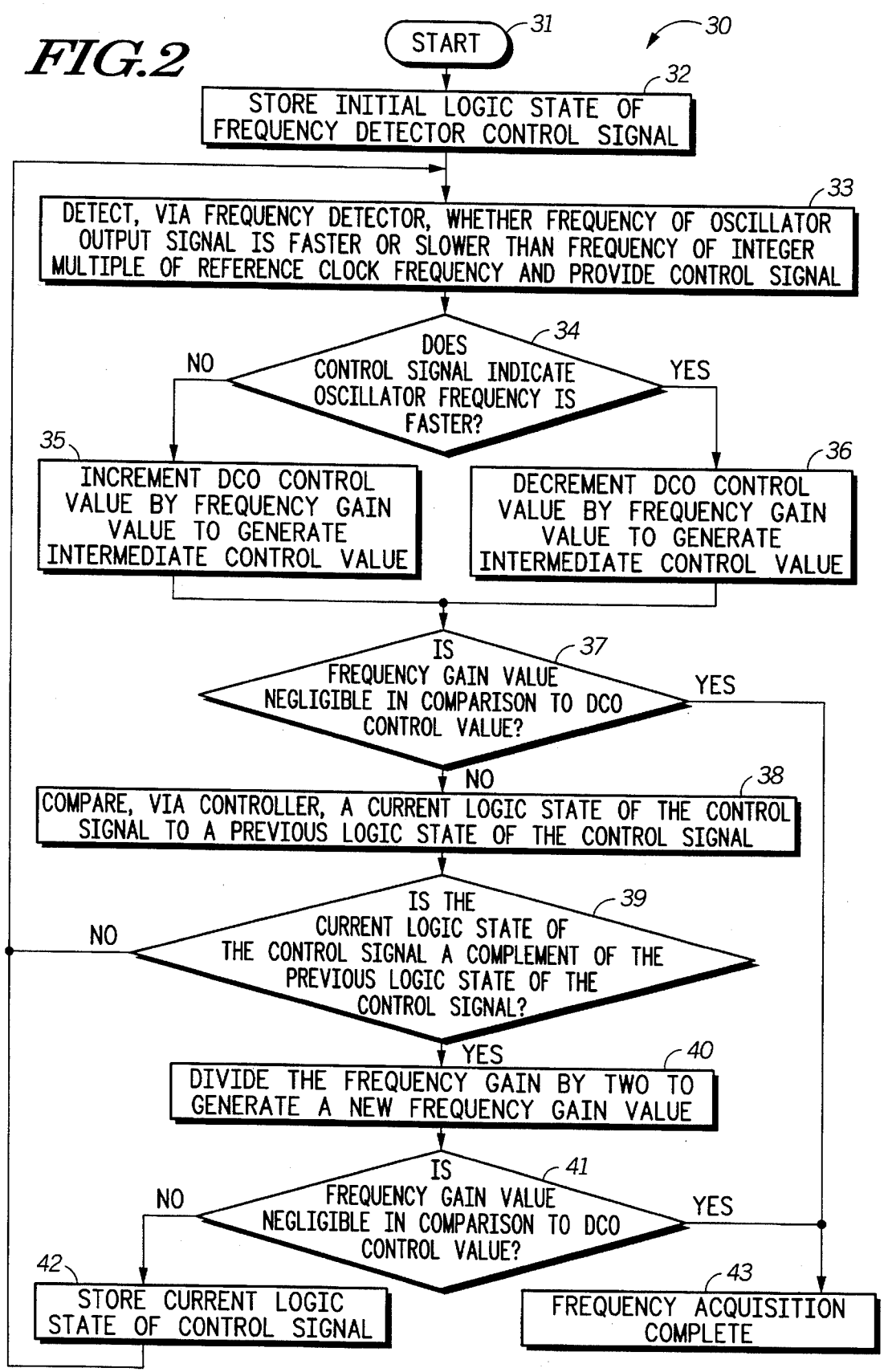
FIG. 2 illustrates in flow diagram form a method for performing frequency acquisition in the all digital phase-locked loop of FIG. 1, in accordance with the present invention.

Illustrated in FIG. 2 is a flow diagram 30 for performing frequency acquisition that may be used to implement the present invention. As illustrated in FIG. 2, an initial logic state (e.g., logic "0" for SLOW, or logic "1" for FAST) of the frequency detector 11 is stored in a one-bit register in the controller 13. The polarity of the initial logic state will cause a decrease in the frequency gain value if a comparison performed at step 39 indicates that the two signals are complementary. In the preferred embodiment, internal clocks (DCO OUTPUT) of a frequency of four times the REFERENCE CLOCK signal are required. The frequency detector 11 will, therefore, detect whether more or less than four internal DCO 16 output cycles occurred during the period of one reference clock cycle, at step 33. If four or more cycles occur, the frequency detector 11 provides a FAST control signal, otherwise the frequency detector 11 will indicate a SLOW control signal.

At decision block 34, the ADPLL 10 determines in which direction the DCO 16 requires adjustment (i.e., faster or slower), based upon the control signal provided by the frequency detector 11. If the frequency detector 11 indicates slow, the speed of the DCO 16 must be increased, as indicated at step 35. Conversely, if the control signal from the frequency detector 11 indicates FAST, the internal oscillator (DCO 16) must be slowed down, as indicated at step 36. The speed of oscillation is directly proportional to the DCO CONTROL value stored in the DCO control register 22. Thus, the speed of the DCO 16 is increased or decreased by incrementing or decrementing, respectively, the DCO CONTROL value, by the frequency gain value stored in the frequency gain register 14.

In accordance with the preferred embodiment of the present invention, frequency acquisition is accomplished via a modified binary search algorithm. Initially, the frequency gain value is a large value, as illustrated in Table 1. Whenever the control signal provided by frequency detector 11 differs from that of a previous cycle, the frequency gain value is reduced by a factor of two. Using this method, initial corrections are large, while subsequent corrections are progressively smaller, allowing for very fast and highly accurate frequency acquisition.

At decision block 37, the ADPLL 10 determines whether the frequency gain is negligible with respect to the DCO CONTROL value. If so, then subsequent increments to the DCO CONTROL VALUE will be insignificant. This indicates that frequency acquisition is complete, as illustrated by step 43. Conversely, if the frequency gain value is not negligible as compared to the DCO CONTROL value, then the controller 13 performs a comparison, at step 38, between the current state of the frequency detector control signal (e.g., "FAST"), and the previously stored logic state of the frequency detector control signal. At decision block 39, the ADPLL 10 determines if the comparison performed at step 38 indicated that the current state of the control signal is a complement of the its previous logic state. If so, then the frequency gain value is divided by two to generate a new frequency gain value, at step 40. By dividing the frequency gain value by two, subsequent increments or decrements to the DCO CONTROL value will be progressively smaller, allowing for finer resolution and increasingly accurate frequency acquisition. The ADPLL 10 determines at decision block 41 whether the frequency gain is negligible with respect to the DCO CONTROL value. If so, then phase acquisition is complete, at step 43. Otherwise, the current logic state of the control signal provided by frequency detector 11 is stored in the controller 13 for use in comparison during a next cycle.

Using the frequency acquisition mechanism of the present invention, it is possible to significantly improve phase-lock times. Unlike the prior art PLL's, the gain value is not constrained; rather, the gain is dynamically changed using a modified binary-search. The improvement in lock time achieved realized due to the frequency acquisition mechanism can significantly reduce power consumption when used with an LPSTOP mechanism.

While the present invention has been described in accordance with a preferred embodiment, it should be apparent to one of ordinary skill in the art that the invention may be practiced in numerous ways. For example, the present invention may be used as a binary search mechanism for acquiring phase in a digital delay element. Accordingly, it is intended by the appended claims to cover all modifications of the invention which fall within the true spirit and scope of the invention.

We claim:

1. In a system having a variable digital oscillator and a frequency detector for comparing a frequency of a reference clock signal to an oscillator output signal, and a controller including an incrementor and a decrementor coupled to said oscillator and a set of oscillator control registers, a method for performing frequency acquisition comprising the steps of:

a) detecting, via said frequency detector, whether a frequency of an output signal of said variable oscillator is faster or slower than an integer multiple of a reference clock frequency, and providing a control signal indicative thereof;

b) incrementing or decrementing, via said controller, a first predefined value stored in a first control register by a second predefined value stored in a second control register to generate an intermediate result value, in response to a current logic state of said control signal, to increase or decrease, respectively, the oscillator frequency;

c) comparing, via said controller, said current logic state of said control signal to a previous logic state of said control signal stored in a third control register, and decreasing the second predefined value by a variable amount when said current logic state of said control signal is a complement of said previous logic state to generate an intermediate increment value;

d) storing the current logic state of said control signal in said third control register; and e) repeating steps a) through d) until the intermediate increment value stored in the second control register is sufficiently smaller than the intermediate result value stored in the first control register, indicating a negligible frequency error between said frequency of said output signal of said variable oscillator and said integer multiple of said reference clock frequency, and that frequency acquisition is complete.

2. The method of claim 1 further comprising the step of initializing said first control register to said first predefined value and said second control register to said second predefined value, said first predefined value controlling a frequency of operation of said oscillator, and said second predefined value defining a magnitude of incremental changes to said frequency of operation of said oscillator, before performing the step of detecting, via said frequency detector, whether a frequency of an output signal of said variable oscillator is faster or slower than an integer multiple of a reference clock frequency, and providing a control signal indicative thereof.

3. The method of claim 1 wherein said step of comparing, via said controller, said current logic state of said control signal to a previous logic state of said control signal stored in a third control register, and decreasing the second predefined value by a variable amount when said current logic state of said control signal is a complement of said previous logic state to generate an intermediate increment value, said controller determines said variable amount by successively dividing said second predefined value by an integer value.

4. The method of claim 1 wherein said step of comparing, via said controller, said current logic state of said control signal to a previous logic state of said control signal stored in a third control register, and decreasing the second predefined value by a variable amount when said current logic state of said control signal is a complement of said previous logic state to generate an intermediate increment value, said controller determines said variable amount by successively dividing said second predefined value by a range of values.

5. In a system having a variable oscillator and a frequency detector for comparing a frequency of a reference clock signal to an oscillator output signal, and a controller coupled to said oscillator and a set of oscillator control registers, a method for performing frequency acquisition comprising the steps of:

a) detecting, via said frequency detector, whether a frequency of an output signal of said variable oscillator is faster or slower than an integer multiple of a reference clock frequency, and providing a control signal indicative thereof;

b) incrementing or decrementing, via said controller, a first predefined value stored in a first control register by a second predefined value stored in a second control register to generate an intermediate result value, in response to a current logic state of said control signal, to increase or decrease, respectively, the oscillator frequency;

c) comparing, via said controller, said current logic state of said control signal to a previous logic state of said control signal stored in a third control register, and decreasing the second predefined value by a variable amount when said current logic state of said control signal is a complement of said previous logic state to generate an intermediate increment value;

d) storing the current logic state of said control signal in said third control register; and e) repeating steps a) through d) for a predefined number of system cycles or until said intermediate increment value equals a predefined value indicative of a negligible frequency error between said frequency of said output signal of said variable oscillator and said integer multiple of said reference clock frequency, and that frequency acquisition is complete.

6. The method of claim 5 further comprising the step of initializing said first control register to said first predefined value and said second control register to said second predefined value, said first predefined value controlling a frequency of operation of said oscillator, and said second predefined value defining a magnitude of incremental changes to said frequency of operation of said oscillator, before performing the step of detecting, via said frequency detector, whether a frequency of an output signal of said variable oscillator is faster or slower than an integer multiple of a reference clock frequency, and providing a control signal indicative thereof.

7. In a system having a variable oscillator and a frequency detector for comparing a frequency of a reference clock signal to an oscillator output signal, and a controller coupled to said oscillator and a set of oscillator control registers, a method for performing frequency acquisition comprising the steps of:

a) initializing a first control register to a first predefined value and a second control register to a second predefined value, said first predefined value controlling a frequency of operation of said oscillator, and said second predefined value defining a magnitude of incremental changes to said frequency of operation of said oscillator;

b) detecting, via said frequency detector, whether a frequency of an output signal of said variable oscillator is faster or slower than an integer multiple of a reference clock frequency, and providing a control signal indicative thereof;

c) incrementing or decrementing, via said controller, said first predefined value stored in said first control register by the second predefined value to generate an intermediate result value, in response to a current logic state of said control signal, to increase or decrease, respectively, the oscillator frequency;

d) comparing, via said controller, said current logic state of said control signal to a previous logic state of said control signal stored in a third control register, and decreasing the second predefined value by a variable amount when said current logic state of said control signal is a complement of said previous logic state to generate an intermediate increment value;

e) storing the current logic state of said control signal in a third control register; and f) repeating steps b) through e) until the intermediate increment value stored in the second control register is sufficiently smaller than the intermediate result value stored in the first control register, indicating a negligible frequency error between said frequency of said output signal of said variable oscillator and said integer multiple of said reference clock frequency, and that frequency acquisition is complete.

8. The method of claim 7 wherein the step of comparing, via said controller, said current logic state of said control signal to a previous logic state of said control signal stored in a third control register, and decreasing the second predefined value by a variable amount when said current logic state of said control signal is a complement of said previous logic state to generate an intermediate increment value, said controller determined said variable amount by successively dividing said second predefined value by an integer value.

9. The method of claim 7 wherein the step of comparing, via said controller, said current logic state of said control signal to a previous logic state of said control signal stored in a third control register, and decreasing the second predefined value by a variable amount when said current logic state of said control signal is a complement of said previous logic state to generate an intermediate increment value, said controller determines said variable amount by successively dividing said second predefined value by a range of values.

10. In a system having a variable oscillator and a frequency detector for comparing a frequency of a reference clock signal to an oscillator output signal, and a controller coupled to said oscillator and a set of oscillator control registers, a method for performing frequency acquisition comprising the steps of:

a) initializing a first control register to a first predefined value to enable said variable oscillator to operate at a frequency corresponding to said predefined value;

b) initializing a second control register to a second predefined value to define a magnitude of a value to increment/decrement the first predefined value stored in the first control register;

c) initializing a third control register;

d) detecting, via said frequency detector, whether a frequency of a variable oscillator output signal is faster or slower than a frequency of a reference clock signal, and providing a control signal indicative thereof, a current logic state of said control signal being stored in said third control register;

e) incrementing or decrementing, via said controller, said first predefined value stored in said first control register by the second predefined value, in response to said control signal, to increase or decrease the oscillator frequency;

f) decreasing, via said controller, the second predefined value by a variable amount when said control signal indicates a logic state change relative to the current value stored in the third control register;

g) storing a new value of said control signal in a third control register; and h) repeating steps d) through g) until the value stored in the second control register is sufficiently small relative to the value stored in the first control register.

11. The method of claim 10 wherein the step of decreasing, via said controller, the second predefined value by a variable amount when said control signal indicates a logic state change relative to the current value stored in the third control register, said controller determines said variable amount by successively dividing said predefined value by an integer value.

12. The method of claim 10 wherein the step of decreasing, via said controller, the second predefined value by a variable amount when said control signal indicates a logic state change relative to the current value stored in the third control register, said controller determines said variable amount by successively dividing said predefined value by a range of values.

13. In a system having a variable oscillator and a set of control registers, a frequency acquisition controller comprising:

a frequency detector, coupled to said variable oscillator, for detecting, for each frequency detect cycle, whether a frequency of an output signal of said variable oscillator is faster or slower than an integer multiple of a reference clock frequency, and providing a control signal indicative thereof; and control logic, coupled to said frequency detector and said set of control registers, for incrementing or decrementing a first predefined value stored in a first control register by a second predefined value stored in a second control register to generate an intermediate result value, in response to a current logic state of said control signal, to increase or decrease, respectively, the oscillator frequency, said intermediate result value being stored in said first control register, said control logic decreasing, after each frequency detect cycle, said second predefined value by a variable amount when said current logic state of said control signal is a complement of a previous logic state to generate and store in said second control register an intermediate increment value until the intermediate increment value stored in the second control register is sufficiently smaller than the intermediate result value stored in the first control register.

14. The frequency acquisition controller of claim 13 wherein said control logic comprises:

adder logic, coupled to said set of control registers, for incrementing said first predefined value stored in said first control register by said second predefined value to generate said intermediate result value when said frequency detector indicates that said frequency of said oscillator should be increased; and subtractor logic, coupled to said set of control registers, for decrementing said first predefined value stored in said first control register by said second predefined value to generate said intermediate result value when said frequency detector indicates that said frequency of said oscillator should be decreased.

15. The frequency acquisition of claim 13 wherein said control logic initializes said first control register to said first predefined value and said second control register to said second predefined value, said first predefined value controlling a frequency of operation of said oscillator and said second predefined value defining a magnitude of incremental changes to said frequency of operation of said oscillator.

16. In a system having a variable oscillator and a set of control registers, a frequency acquisition controller comprising:

a frequency detector, coupled to said oscillator, for detecting, for each frequency detect cycle, whether a frequency of an output signal of said oscillator is faster or slower than an integer multiple of a reference clock frequency, and providing a control signal indicative thereof; and control logic, coupled to said frequency detector and said set of control registers for incrementing or decrementing a first predefined value stored in a first control register by a second predefined value stored in a second control register to generate an intermediate result value, in response to a current logic state of said control signal, to increase or decrease, respectively, the oscillator frequency, said control logic comparing, after each frequency detect cycle, said current logic state of said control signal to a previous logic state of said control signal stored in a third control register, and decreasing the second predefined value by a variable amount when said current logic state of said control signal is a complement of said previous logic state to generate an intermediate increment value until the intermediate increment value stored in the second control register is sufficiently smaller than the intermediate result value stored in the first control register, indicating a negligible frequency error between said frequency of said output signal of said oscillator and said integer multiple of said reference clock frequency, and that frequency acquisition is complete.

17. The frequency acquisition controller of claim 16 wherein said control logic comprises:

adder logic, coupled to said set of control registers, for incrementing said first predefined value stored in said first control register by said second predefined value to generate said intermediate result value when said frequency detector indicates that said frequency of said oscillator should be increased; and subtractor logic, coupled to said set of control registers, for decrementing said first predefined value stored in said first control register by said second predefined value to generate said intermediate result value when said frequency detector indicates that said frequency of said oscillator should be decreased.

18. The frequency acquisition of claim 16 wherein said control logic initializes said first control register to said first predefined value and said second control register to said second predefined value, said first predefined value controlling a frequency of operation of said oscillator and said second predefined value defining a magnitude of incremental changes to said frequency of operation of said oscillator.

19. A system for performing frequency acquisition comprising:

a digitally controlled variable oscillator;

a set of control registers, coupled to said variable oscillator, for storing, in a first control register, a binarily-weighted control value for implementing changes to frequency and phase of said digitally controlled variable oscillator, and for storing, in a second control register, a gain value defining a magnitude of value to increment/decrement said binarily-weighted control value;

a frequency detector, coupled to said variable oscillator, for detecting, for each frequency detect cycle, whether a frequency of an output signal of said digitally controlled variable oscillator is faster or slower than an integer multiple of a reference clock frequency, and providing a control signal indicative thereof; and control logic, coupled to said frequency detector and said set of control registers, for incrementing or decrementing said binarily-weighted control value by said gain value after each frequency detect cycle, to generate an intermediate control value, in response to a current logic state of said control signal, to increase or decrease, respectively, the oscillator frequency, said intermediate control value being stored in said first control register, said control logic decreasing, after each frequency detect cycle, said gain value by a variable amount when said current logic state of said control signal is a complement of a previous logic state to generate and store in said second control register an intermediate gain value, until the intermediate gain value is sufficiently smaller than the intermediate result value stored in the first control register.

20. The system of claim 19 wherein said control logic comprises:

adder logic, coupled to said set of control registers, for incrementing said binarily-weighted control value stored in said first control register by said gain value to generate said intermediate control value when said frequency detector indicates that said frequency of said oscillator should be increased; and subtractor logic, coupled to said set of control registers, for decrementing said binarily-weighted control value stored in said first control register by said gain value to generate said intermediate control value when said frequency detector indicates that said frequency of said oscillator should be decreased.

* * * * *